June 29, 1965 J. E. WARTHAN 3,191,446

FINE TUNING MECHANISM FOR TELEVISION TUNERS

Filed Jan. 21, 1964 5 Sheets-Sheet 1

INVENTOR

JIMMIE E. WARTHAN

BY Mason, Kolehmainen, Rathburn and Wyss.

ATT'YS

June 29, 1965 J. E. WARTHAN 3,191,446

FINE TUNING MECHANISM FOR TELEVISION TUNERS

Filed Jan. 21, 1964 5 Sheets-Sheet 2

INVENTOR
JIMMIE E. WARTHAN

BY Mason, Kolehmainen, Rathburn and Wyss.
ATT'YS

June 29, 1965 J. E. WARTHAN 3,191,446

FINE TUNING MECHANISM FOR TELEVISION TUNERS

Filed Jan. 21, 1964 5 Sheets-Sheet 3

INVENTOR
JIMMIE E. WARTHAN
BY Mason, Kolehmainen, Rathburn and Wyss.
ATT'YS

INVENTOR
JIMMIE E. WARTHAN
BY Mason, Kolehmainen, Rathburn and Wyss.
ATT'YS

INVENTOR
JIMMIE E. WARTHAN
BY Mason, Kolehmainen,
Rathburn and Wyss.
ATT'YS

United States Patent Office
3,191,446
Patented June 29, 1965

3,191,446
FINE TUNING MECHANISM FOR TELEVISION TUNERS

Jimmie E. Warthan, Stinesville, Ind., assignor to Sarkes Tarzian, Inc., Bloomington, Ind., a corporation of Indiana Filed Jan. 21, 1964, Ser. No. 339,289
30 Claims. (Cl. 74—10)

The present invention relates to television tuners, and, more particularly, to television tuners of the type employing a rotary selector switch having a plurality of channel selecting positions, one position being provided for each television channel to be received.

Present-day television tuners are generally either of the rotary switch or turret types. Rotary switch tuners employ a plurality of switch wafers rotatable in unison and each carrying a plurality of contacts engageable with different fixed contacts spaced about the wafer periphery while turret tuners employ a plurality of carriers or sticks each carrying different sets of impedance elements. In both types of tuners a common, incrementally rotatable channel selector shaft is employed for selectively connecting certain ones of a plurality of tuned circuit elements into operative circuit relationship with the other tuner elements. For each channel selecting position of the shaft, the oscillator portion of the tuner is tuned, by certain ones of the selected tuned circuit elements, to a particular frequency so that when the oscillator signal is heterodyned with the received signals, the selected one of the received signals is converted to an intermediate frequency signal of proper frequency for efficient translation through the IF channel of the associated receiver.

Because of the difficulty of accurately setting the values of the tuned circuit elements and because of the desirability of accurately tuning the oscillator to each of a plurality of predetermined frequencies, it has been found necessary to include in the oscillator circuit a reactance device having an adjustable value and usually referred to as the fine tuning impedance. Moreover, inasmuch as the values of other circuit parameters in the oscillator such, for example, as tube constants, vary with the age of the tuner, it is desirable, in order to insure that the receiver operates at maximum efficiency at all times, that this adjutable reactance be so constructed as to be readily adjustable by the user of the receiver whenever necessary. In some prior art devices this is accomplished by a vernier tuning shaft, usually concentrically mounted with respect to the channel selector shaft and connected to the adjustable reactance and this vernier shaft is adjustable by the viewer each time that he retunes the receiver to select a different channel.

In order to eliminate this frequent adjustment of the vernier tuning shaft of the tuner, it has been the practice in other prior art devices to provide a separate vernier tuning reactance for each channel and to employ the main tuning shaft and its associated components to selectively connect a different preadjusted one of these reactances into the oscillator circuit simultaneously with the connection of a new set of tuned circuit elements. A primary disadvantage of such an arrangement is that in each tuner a large number of adjustable reactances must be provided which creates a number of problems. One of these problems is that since such reactances are relatively large, they occupy a considerable amount of space in the tuner and thus impede the trend of modern design toward smaller and smaller tuners. Another problem is that such reactances are relatively expensive and the use of large numbers of them appreciably increases the cost of the tuner.

In order to enable a reduction in the overall size of a tuner, to reduce the manufacturing cost of the tuner and to improve the reliability of operation thereof, it is desirable to provide a single vernier tuning reactance which is operatively connected in the oscillator circuit and which is adapted to be preadjusted for each channel selecting position of the selector shaft so as to have fixed values of reactance for each of the channel selecting positions of the channel selector shaft. In this manner, the space requirements of the vernier tuning reactance, which is located within the shielded compartment of the tuner, are minimized, and the effective value of the vernier tuning reactance for each channel selecting position of the tuning shaft may be adjusted when necessary as, for example by a technician when the set is first installed in the home. Fine tuning arrangements of this general type have been used before and are called "memory" fine tuners.

Various memory fine tuning arrangements have been proposed to eliminate the necessity for adjustment of the vernier tuning shaft of the tuner by the user in each channel position of the station selector shaft. One such arrangement employs a single vernier tuning impedance which is operatively connected in the oscillator circuit at all times and is automatically adjusted by a memory tuning mechanism in each channel selecting position of the selector shaft so as to provide a desired setting of the vernier tuning impedance, which setting may, however, be changed manually by the user if desired. Such an arrangement is described and claimed in U.S. Patent No. 2,947,866 issued August 2, 1960, to Alarico A. Valdettaro and Stanely R. Meadows, and assigned to the same assignee as the present invention. In accordance with the present invention the manual adjustment of vernier tuning by the user is accomplished by manipulation of the fine tuning knob in the conventional manner while at the same time providing a memory tuning function by this same motion of the fine tuning knob.

It is an object of the present invention to provide a fine tuning arrangement of the character described using a variable fine tuning reactance having a spring biased plunger action against a pivoted lever to urge a pair of V-shaped bearing surfaces on this lever against a pivot pin, thereby providing a construction having excellent resettability characteristics.

A further object of the invention is to provide a new and improved fine tuning construction which is compactly arranged and yet possesses excellent resettability or repeatability qualities.

It is also an object of the invention to provide a fine tuning construction which is relatively immune to mechanical tolerances in the linkage acting on the fine tuning reactance.

It is another object of the invention to provide a memory fine tuning arrangement having a new and improved adjustable mechanism acting on the linkage which mechanism is effective to maintain the setting of the fine tuning impedance over a relatively wide range of tolerances of the parts.

A further object of the invention is to provide a new and improved carrier for the adjustable screws which carrier permits each screw to turn at both its two extremes of range of adjustment without causing further axial movement of the screw, thus preventing damage to any of the component parts.

Another object of the invention is to provide a new and improved adjusting screw for use in fine tuning mechanism of the character described above.

The invention also has for an object the provision of a carrier for the adjustable screws employing a single multifinger spring retainer for holding all of the screws in adjusted position.

It is another object of the present invention to provide a new and improved spring retainer for a plurality of radially arranged adjustment screws wherein facilities are provided for preventing inward movement of the screws in response to forces exerted on the outer ends thereof.

It is a further object of the present invention to provide a new and improved carrier for a plurality of radially arranged adjustment screws wherein a V-type bearing is provided for each screw so as to prevent rocking and misalignment thereof when in use.

Still another object of the present invention resides in the provision of a carrier for a plurality of radially arranged adjustment screws and a single spring retainer having a plurality of fingers one for each screw, the tips of said fingers being adapted to engage said screws and hold the same in said carrier and at the same time provide for threaded adjustment thereof.

A still further object of the invention is to provide an adjusting mechanism of the type described wherein a crown gear is moved axially of the channel selector shaft by turning the fine tuning knob but wherein means are provided for preventing the latter knob from being pushed axially along the shaft to move the crown gear.

Briefly, in accordance with the present invention, a memory fine tuning mechanism is provided by providing a single fine tuning reactance for all of the television channels and including a movable plunger biased by a spring into engagement with one end of a lever. A bearing channel formed integral with the other end of the lever provides a pair of V-shaped bearing surfaces which are urged against a fixed pivot pin by the biasing spring of the variable fine tuning reactance. The lever is pivoted about the pin by lever actuating means acting against the lever at a point intermediate the plunger and the bearing channel. The lever actuating means comprises a carrier holding a number of individually adjustable screws, one for each television channel, and rotatable with the channel selector shaft of the tuner. A single retainer having a plurality of spring fingers holds the screws on the carrier and permits their axial adjustment to move them radially of the carrier. The retainer is constructed to permit each finger to ride up on the threads of its associated screw whenever the screw reaches one of its limiting end positions, thus permitting the screw to turn after it has reached the end position without causing further movement radially of the carrier. This construction prevents damage to the component parts.

An adjusting mechanism is provided for turning each screw in the event that it becomes desirable to alter the fine tuning of the television channel corresponding to that screw. This adjusting mechanism comprises a single pinion engageable with a gear formed on each screw and permanently meshing with a crown gear mounted for axial movement along the channel selector shaft. The fine tuning knob of the tuner, which is concentric with the channel selector shaft is employed to drive a cam sleeve which, in turn, cooperates with a support for the crown gear to move the latter axially along the channel selector shaft and, hence, to move the pinion into engagement with a selected one of the adjustable screws. The cam sleeve is held against axial movement along the channel selector shaft in either direction by a pair of spaced retainer clips and a cooperating bearing ring which effectively minimize wear problems. One of the retainer clips limits axial movement of the crown gear and its support in a direction toward the fine tuning knob. The cam sleeve and the crown gear support having mating helical surfaces for transforming the rotary movement of the fine tuning knob into axial movement of the support and the crown gear. Thus, when the fine tuning knob is manually rotated in either direction the crown gear and its support first move axially along the channel selector shaft until the pinion engages the adjusting screw corresponding to the television channel selected by the shaft, whereupon continued rotation of the fine tuning knob is effective to turn the crown gear, the pinion and the selected screw in order to adjust the fine tuning of the selected channel. A slip clutch acting between the crown gear and its support insures that these elements move together during axial shifting along the channel selector shaft but this clutch permits the crown gear to turn upon its support upon further rotation of the fine tuning knob in either direction. A beehive spring interposed between the crown gear support and the carrier for the adjusting screws acts to return the crown gear and its support to its original position axially of the shaft if the fine tuning knob is released. When this occurs the pinion is disengaged from the adjusting screw and remains disconnected until a further fine tuning adjustment of that screw or another fine tuning adjustment of a different adjusting screw is required.

The invention, both as to its organization and manner of operation, together with further objects and advantages may best be understood by reference to the following detailed description taken in conjunction with the accompanying drawings wherein.

Figures 1, 2:
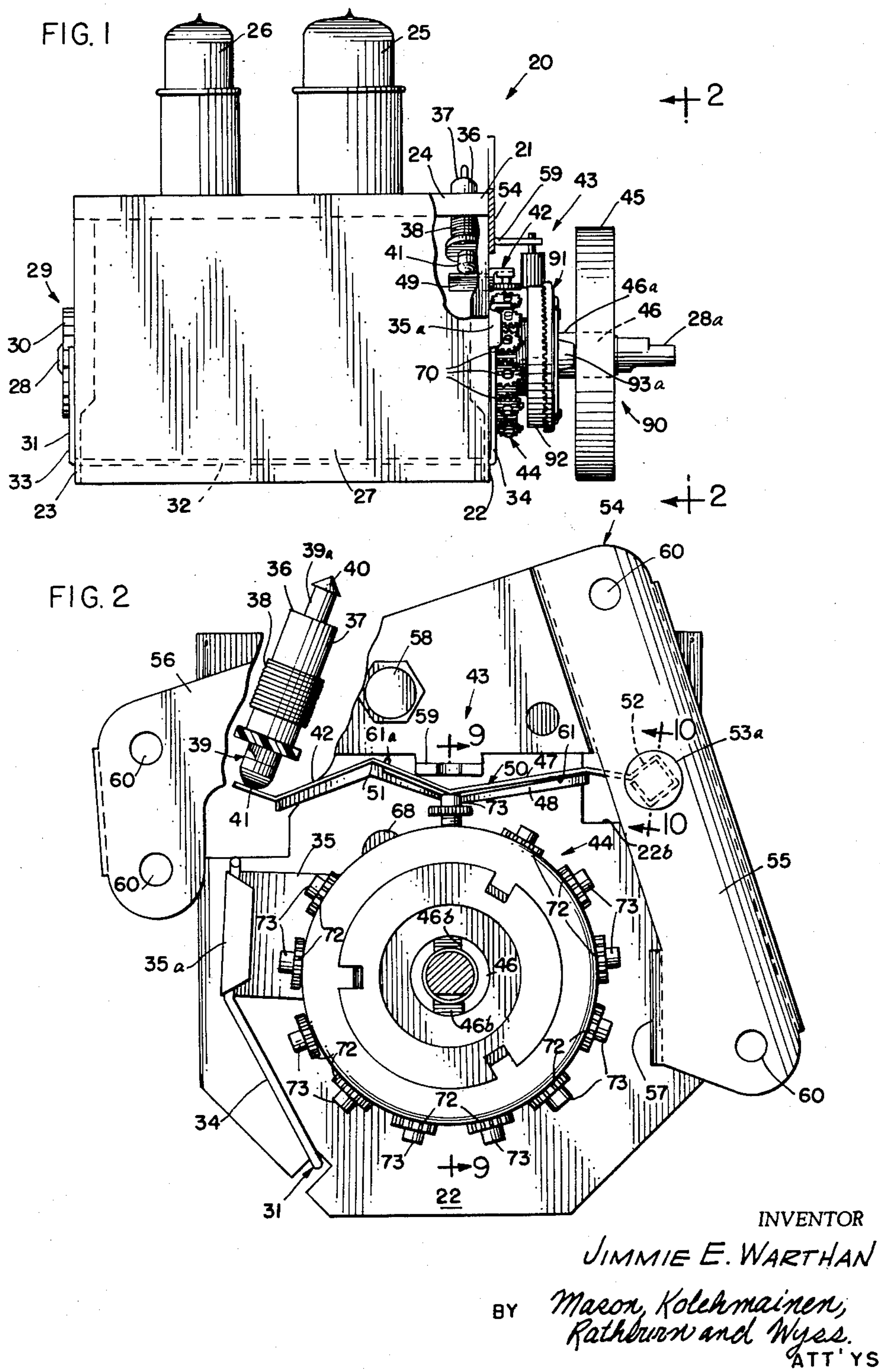
FIG. 1 is a side elevational view of a television tuner embodying certain features of the present invention with a portion of the shielding cover being broken away to show the variable fine tuning impedance and other component elements.
FIG. 2 is an enlarged end view of the tuner taken from the line 2—2 in FIG. 1.
Figure 3:
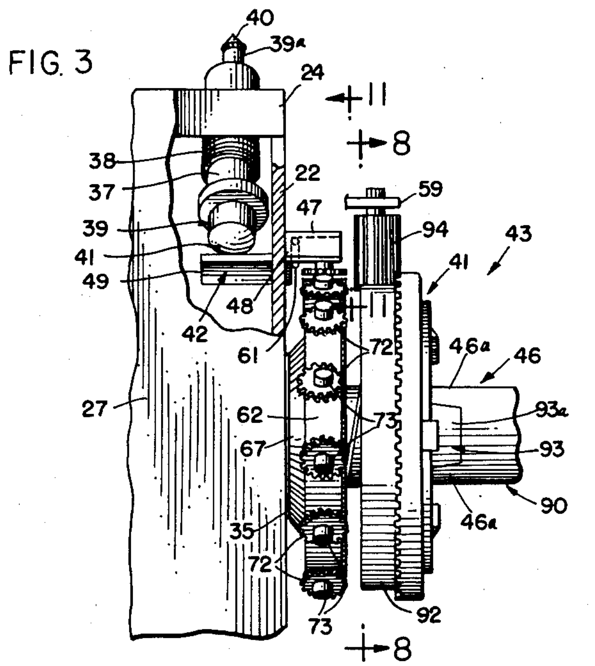
FIG. 3 is an enlarged, fragmentary, side elevational view of the fine tuning arrangement employed in the tuner shown in FIG. 1 under conditions when the screw adjusting mechanism is disconnected from the fine tuning screws.
Figure 4:
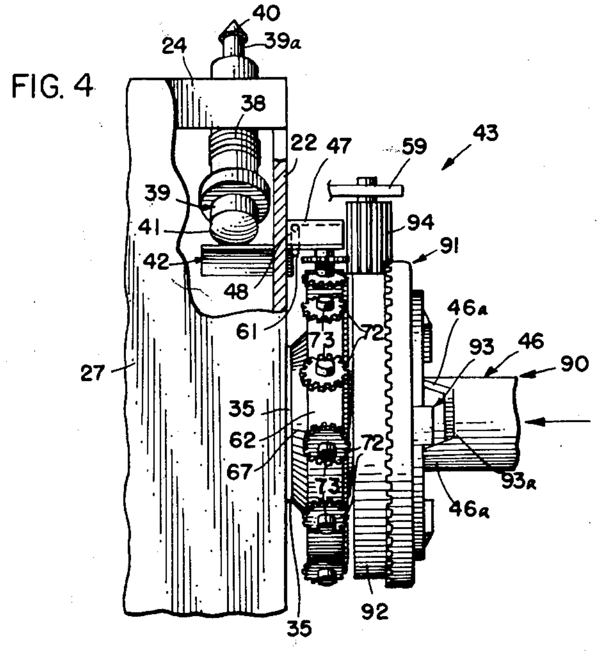
FIG. 4 is an enlarged, fragmentary, side elevational view similar to FIG. 3, but shows the memory fine tuning arrangement under conditions where the screw adjusting mechanism has been moved axially of the channel selector shaft and is in engagement with one of the fine tuning screws.

Referring now to the drawings and first to FIG. 1 thereof, the present invention is there illustrated as comprising a television tuner indicated generally by the reference numeral 20 and including a substantially U-shaped chassis 21 having front and rear walls 22 and 23 interconnected by a top deck portion 24 on which are mounted the tube sockets for a pair of tubes 25 and 26. A sheet metal cover 27 extends around the exposed sides and bottom of the chassis 21 and cooperates with the top deck portion and with the front and rear walls of the chassis to form a chamber completely enclosing and shielding the component elements located therein. The chassis supports a rotary channel selector switch and there is provided a main channel selector shaft 28 extending through aligned openings respectively provided in the front and rear walls 22 and 23 and through the tuning compartment.

A suitable detent mechanism generally indicated by the reference numeral 29 is effectively connected between the main channel selector shaft 28 and the rear wall 23 of the chassis to facilitate the accurate positioning of the shaft 28 in each of its channel selecting positions. As is well known in the art, the main tuning shaft or channel selector may be rotated to different preselected positions to tune the television receiver to different channels and in each position a different one of the tuned circuit elements located within the tuning compartment is connected into circuit relationship with the oscillator of the tuner, thereby selectively controlling the frequency of oscillation. The detent mechanism for indexing and holding the channel selector shaft 28 in each of these channel selecting positions is preferably of the type shown and described in Valdettaro and Badger application Serial No. 63,889, filed October 20, 1960, and assigned to the same assignee as the present invention. As is described in detail in the latter application, the station shaft 28 is of the splined type to permit removal of the shaft and suitable grooves are provided in the shaft for seating on V-shaped bearing surfaces (not shown) provided in the end walls 22 and 23 of the tuner chassis. The rearwardly disposed end portion of the shaft 28 extending beyond the rear wall 23 is of double D cross section and is inserted through an aperture of corresponding configuration formed centrally in a detent wheel or plate 30. The latter wheel has a toothed peripheral portion cooperating with a torsion bar spring 31 to index and accurately position the main tuning shaft 28 in each of the channel selecting positions. The torsion bar spring 31 is of the type described in detail in the above-identified application Serial No. 63,889 and includes a center or bight portion 32 and a pair of end portions or arms 33 and 34. The torsion bar spring 31 is secured within aligned apertures or openings formed in the front and rear walls 22 and 23 respectively and the hooked end of the arm 33 seats within one of the interdental notches of the detent wheel 30 to force the rearward end of the shaft 28 against a V-shaped bearing surface on the rear wall 23. The forward arm 34 engages a forwardly bent leg or ledge 35*a* formed on a bearing plate 35 which extends along the front wall 22 of the chassis and which engages the forward end of the channel selecting shaft 28 to bias this shaft against the V-shaped bearing in the front wall 22. Thus, the torsion bar spring 31 performs the dual function of coacting with the toothed wheel 30 to index the channel selector shaft 28 in each of its channel selecting positions and also to bias both the rearward and forward ends of the channel selector shaft against the V-shaped bearing surfaces respectively provided adjacent the openings in the front and rear walls 22 and 23.

In order to permit fine adjustment of the frequency of oscillation of the oscillator for each channel selecting position of the shaft 28, a variable fine tuning reactance 36 is permanently connected in the oscillator circuit and is designed to provide adjustment of the frequency of oscillation over a relatively narrow range as compared with the range of frequencies controlled by the tuned circuit elements connected into the oscillator circuit through adjustment of the main tuning shaft 28. The variable reactance 36 may be either a variable capacitor or a variable inductor but is shown in the drawings as a variable inductor comprising a tubular coil form or support 37 suitably mounted on the front wall 22 of the tuner chassis and formed of a suitable dielectric material such as nylon. An inductor winding formed by several turns of copper wire 38 is wound around the coil form 37 and has its opposed ends suitably connected to the oscillator circuit. The inductance is varied through movement of a plunger 39 comprising a core of magnetic material axially movable within the coil form 37. One end 39*a* of the plunger extends through the coil form and has an enlarged outer end portion 40 which coacts with the end of the coil form to limit the inward movement of the plunger. The plunger is normally urged downwardly as viewed in FIG. 2 by means of a coil spring (not shown) disposed within the coil form 37 and acting against the plunger. The lower end 41 of the plunger seats against a lever 42 forming part of the memory fine tuning arrangement of the present invention which arrangement is generally indicated by the reference numeral 43.

The fine tuning mechanism 43 includes lever actuating means 44 rotatable with the shaft 28 and acting against the lever 42 to orient the lever at a predetermined position for each channel selecting position of the shaft 28, thereby to set the inductance of the fine tuning device 36 at a preselected value corresponding to the television channel selected. After the means 44 has been initially adjusted to provide the desired inductance for optimum tuning of each channel selected, the tuner 20 may be properly tuned to each channel merely by turning the shaft 28 to the desired channel selecting position through use of a suitable knob (not shown) attached to the extreme, outer, D-shaped end 28*a*. The fine tuning will be automatically set by the pre-adjustment of the means 44 and this fine tuning will remain effective unless there is some variation in one or more of the tuner components as, for example, a variation due to age or wear of one or more of the electrical or mechanical parts, a variation due to vibration or shock, or other similar causes. If variations of this nature occur to affect the frequency of oscillation of the oscillator it is necessary to adjust the fine tuning impedance 36 to compensate for them. This fine tuning adjustment is effected, in a manner which will be evident from the ensuing description, by turning a fine tuning knob 45 mounted upon a sleeve 46 concentric with the main channel selecting shaft 28.

Considering next the lever 42 and referring particularly to FIGS. 1, 2, 3 and 4 it will be observed that this lever comprises an elongated body portion 47 having a depending flange 48 at one side lying adjacent the front wall 22 of the tuner. An integrally formed ledge 49 at one end of the body portion 47 extends inwardly through an opening 22*a* in the front wall 22 and underlies the plunger 39. The rounded end 41 of the plunger is spring biased into engagement with the ledge 49 so that the plunger is moved axially of the coil form 37 when the lever is moved by the lever actuating means 44. The latter means acts against an apex 50 (FIG. 2) formed by bending the body portion 47 of the lever. The body portion 47 is also bent as indicated at 51 to orient the ledge 49 properly with respect to the rounded end of the plunger 39. A relatively thin wire or other protrusion 61 is carried on the body portion 47 adjacent the flange 48 in the region of the apex 50 for a purpose which will become apparent as the description proceeds. If a wire is used as shown it is preferably soldered to the underside of the body portion 47 and has an upwardly bent end 61*a* extending through a small aperture in the body portion to hold the wire in position.

Figure 10:
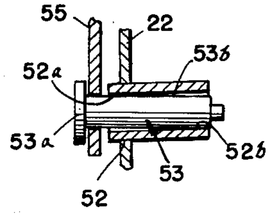
FIG. 10 is a sectional view taken along a line substantially corresponding to the line 10—10 in FIG. 2 and shows the bearing channel and the pivot pin forming the pivot support for the end of the fine tuning lever of the tuner illustrated in FIG. 1.

The lever 42 further includes an enlarged, integral end portion at the opposite end from the ledge 49 and this end portion is bent to form a bearing channel 52 of generally square shaped cross section. The bearing channel extends inwardly through an opening 22*b* in the front wall 22 of the tuner chassis generally parallel to the ledge 49 and embraces a pivot pin 53 carried in fixed position upon a somewhat L-shaped bracket 54 rigidly secured to the tuner chassis. As is best shown in FIG. 10 the pin 53 includes an enlarged head 53*a* and a stem portion 53*b* drive fitted into a small opening in the bracket 54 and extending loosely into the bearing channel 52. The plunger acting on the ledge 49 forces the apex 50 of the lever against the lever actuating means 44 so that the latter members cooperate to form a fulcrum for the lever. Since the axis of the biasing spring of the variable tuning reactance 36 is offset from the fulcrum or apex 50 of the lever system the bearing channel 52 is effectively twisted or tilted about its longitudinal axis as shown in FIG. 10 to provide the two V-shaped bearing surfaces one of which is indicated at 52*a* and the other of which is indicated at 52*b*. The biasing spring of the tuning device 36 thus seats the bearing channel against the pivot pin 53 to remove all of the slop from the lever system and to make this system independent of tolerance variations existing between the fulcrum or apex 50 and the ledge 49. The described arrangement provides good resetability of the position of the plunger 39, an advantage which is difficult to achieve in a small, compact unit having relatively short lever arms.

The L-shaped bracket 54 is best shown in FIG. 2 and includes two arms 55 and 56 with the arm 55 carrying the pivot pin 53. The arm 55 is also provided with an inwardly extending, integral hooked ear 57 which seats within a small opening in the front wall 22 and which has an inner bent or twisted portion (not shown) for locking the bracket in position on the tuner chassis. The bracket 54 is further secured to the tuner chassis by a machine screw 58 extending through an aperture in the leg 56 and threaded into a tapped opening in the front wall 22. The leg 56 has an outwardly extending integrally formed fork 59 cooperating with the lever actuating means 44 in a manner which is described more fully hereinafter. The bracket 54 may be provided with a plurality of apertures 60 to facilitate mounting the tuner on the television chassis or the housing for the television set.

Turning next to the lever actuating means 44 and referring particularly to FIGS. 2, 3, 4, 5 and 6 it will be observed that this means comprises a disc or screw carrier 62 which has a central hub 63 and a plurality of radial openings or slots 64 each opening to the periphery of the disc. A pair of diametrically opposed aligned openings 65 in the hub 63 receive a pin 66 to lock the screw carrier 62 for rotation with the main selector shaft 28 and also to position the carrier accurately in angular position upon the shaft 28. To this end, the pin 66 extends through the aligned openings 65 and through another opening in the shaft whereupon the ends of the pin are flattened or peened to complete the assembly. The pin 66 prevents axial movement of the screw carrier 62 along the shaft 28. The screw carrier 62 further includes an inwardly extending, enlarged boss or collar 67 which seats against the plate 35 to orient the carrier in proper position relative to the lever 42. A protuberance or tooth 68 extends radially outward from the periphery of the disc 62 for a purpose which will become evident as the description proceeds.

Figure 5:
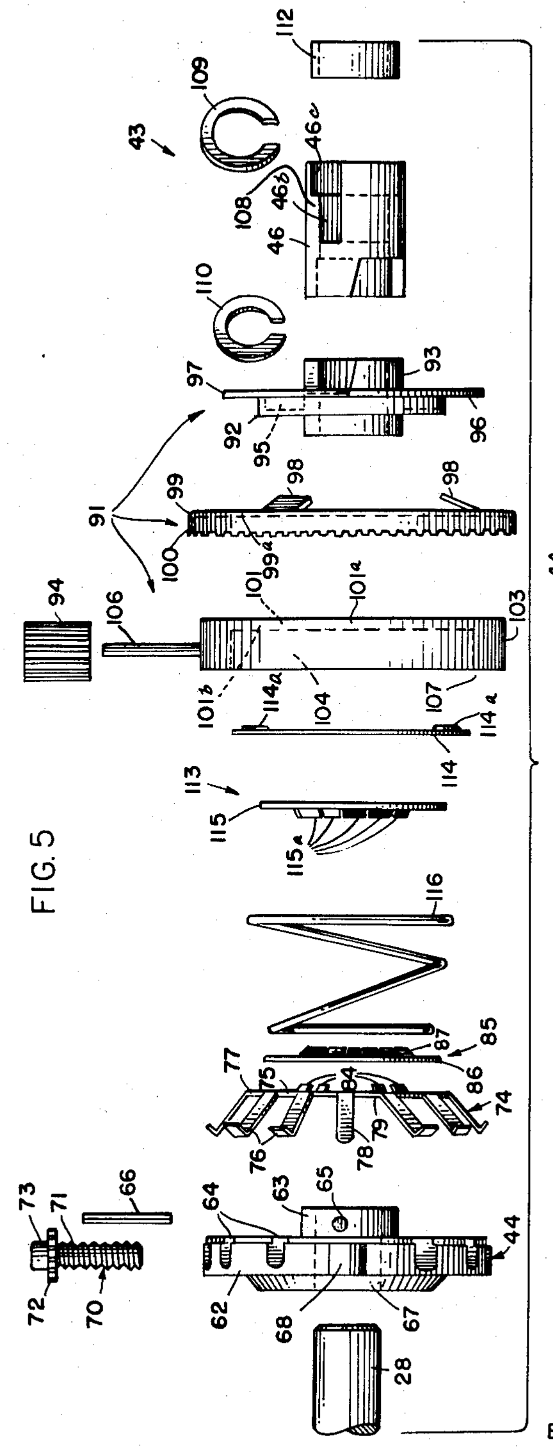
FIG. 5 is an exploded view showing the component elements of the fine tuning mechanism employed in the tuner shown in FIG. 1 with certain of these elements being shown in perspective.
Figure 7:
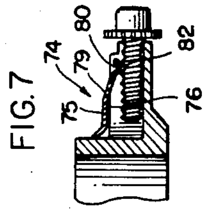
FIG. 7 is an enlarged sectional view taken along a line substantially corresponding to the line 7—7 in FIG. 6.
Figure 6:
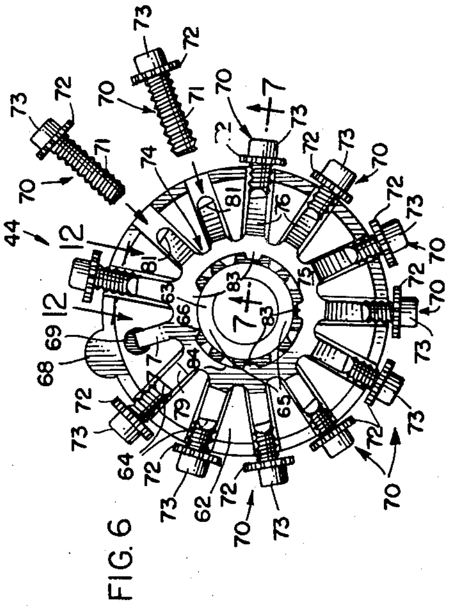
FIG. 6 is an end view of the carrier for the fine tuning screws and shows two of these screws removed from the carrier.
Figure 12:
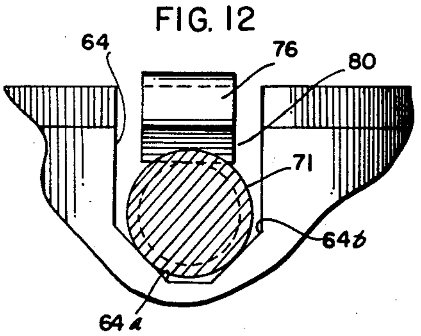
FIG. 12 is a sectional view taken on an enlarged scale along the lines 12—12 of FIG. 6.

Each of the radial slots 64 accommodates a screw 70 one such screw being provided for each television channel so that a total of twelve screws are used as shown in FIG. 6. These screws are identical and each comprises a threaded stem 71 extending into its associated radial slot 64 and a toothed annular collar 72 forming a gear adjacent a cylindrically shaped head 73. The screws 70 are held within their respective slots 64 by means of a common spoked spring wheel or retainer 74 which retainer is best shown in FIGS. 5 and 6 and comprises a central annular portion 75 having a plurality of radial fingers 76 extending outwardly therefrom, one such finger being provided for each of the slots 64. For the purpose of properly orienting the spring wheel 74 on the disc 62, there is an additional finger 77 extending outwardly from the annular portion 75 and this additional finger has a bent integral tongue 78 thereon seating within an opening 69 extending through the disc and parallel to the shaft 28. The tongue 78 is relatively long and, hence, during assembly of the parts it enters the opening 69 before the fingers 76 enter their associated slots 64. Thus, the tongue accurately locates the spring wheel 74 and locks it for rotation with the disc 62 and this tongue also correctly positions the fingers 76 for entry into the slots 64. Each of the fingers 76 is bent as indicated at 79 to permit flexing or deflection about this point. As is best shown in FIG. 7, the end of each finger is bent to form a V-shaped portion 80 for engaging the threads of its associated screw 70. Normally, the V-shaped portion 80 of each finger rides in the interdental space between the teeth of the threads formed on the stem 71 of the screw and, hence, when the screw is turned by rotating the gear 72 in a manner described hereinafter, the screw is threaded axially into or out of the slot 64, the direction of axial movement, of course, being dependent upon the direction of turning of the gear 72. As best shown in FIG. 12, the slots 64 are preferably provided with sloping shoulders 64*a* and 64*b* at the bottom of the slot 64 and the threads of the screw 71 are pressed against these shoulders by the V-shaped portion 80 and ride on these shoulders as the screw is adjusted longitudinally within the slot 64. With this arrangement, an accurate bearing surface for the adjustment screws is provided so that these screws are not rocked or twisted out of position when torque is exerted on the gear teeth 72 as the screw is adjusted. Also this bearing arrangement provides more accurate resettability of the fine tuning impedance upon repeated selection of the same television channel.

Each screw is movable into or out of its slot between limiting end positions which correspond to the end positions of the plunger 39 in its movement between the ends of the range of adjustment of the variable fine tuning reactance 36. One of the limiting end positions of the screw 70 occurs when the screw is fully inserted into the slot 64 so that its annualar collar or gear 72 engages the periphery of the carrier 62. When this occurs further tuning of the gear 72 is effective to turn the screw so that the V-shaped portion 80 rides out of the interdental space and up onto the crest of the thread. As the gear is turned, the V-shaped portion alternately rides up onto the crest and back down into the interdental space thus providing an audible clicking noise which informs the operator that an end position has been reached. When this occurs, the screw cannot advance further into the slot but is instead free to rotate. The second limiting end position is reached when the screw is threaded out of the slot 64 to pivot the lever 42 about the pin 53 to its full clockwise position as viewed in FIG. 2. The clockwise pivoting movement of the lever 42 is limited by engagement of the elongated body portion 47 with the edge of the fork 59 and, when this occurs, further movement of the screw 70 out of the slot 64 is impossible. When the second limiting end position is reached the V-shaped portion 80 again rides out of the interdental space of the threads and up onto a crest, thus preventing further movement of the screw out of the slot 64. When the screw is in the second limiting end position, the force applied by the lever actuating means 44 tends to tilt the screw about the hooked portion 80 in a direction tending to withdraw the gear 72 from its driving gear. However, the wire or protuberance 61, which is located adjacent the head 73, limits the tilting of the screw 70 and, hence, prevents the gear 72 from being disengaged from its driving gear.

As is best shown in FIG. 6, the apex 81 of each V-shaped portion 80 is skewed to fit the helix of the screw threads. More specifically, the lines formed by the apex 81 do not lie exactly perpendicular to a radius passing through the center of the disc 62 but instead are slightly skewed for the purpose indicated above. The screws 70 are preferably formed of steel to improve the wear characteristics and the threads on the stem 71 of each screw are rolled as indicated at 82 in FIG. 7 to avoid peaked or sharp edged thread crests. The use of rolled threads reduces friction and also permits the V-shaped portion 80 to ride up on the crest when the screw reaches either of the limiting end positions. The pitch of the threads is selected to permit the V-shaped portion 80 to ride up on the crest relatively easily but, at the same time, to cooperate with the V-shaped portion to provide sufficient force to hold the screw 70 in position under all conditions where such riding up is not desired. Thus, as the channel selector shaft is turned from position to position during the described selection of a channel, the biasing spring of the variable inductor 36 applies a force against the end of the lever 42 which is transmitted through the apex 50 and the screw head 73 engaged thereby to urge the screw threads against the hooked portion 80 and axially inward of the slot 64. The spring finger 76 must possess sufficient strength to resist this force in order to prevent undesired movement of the screw which would, of course, alter the fine tuning adjustment of its channel. To provide this force while, at the same time, permitting the hooked portion 80 to ride up the threads relatively easily, the pitch of the threads on the stem 71 is relatively small, that is, in the neighborhood of 48 threads per inch.

The spring wheel 74 also has a plurality of radial lugs extending inwardly from the annular portion 75. Four of these lugs identified by the reference numeral 83 in FIG. 6 lie in the same plane as the annular portion 75 and have their extreme inner ends bearing on the periphery of the hub 63 to center the spring wheel thereon. One of these four lugs is illustrated as being considerably wider than the other three. Eight locking lugs 84 are bent with respect to the annular portion 75 and extend inwardly to engage the hub 63 in order to inhibit axial movement of the spring wheel 74 in a direction away from the front wall 22 of the tuner chassis. The spring wheel 74 is held on the hub by a retainer 85 (FIG. 5) consisting of an outer ring 86 having a plurality of uniformly spaced, integral, inwardly extending lugs 87 bent at a slight angle with respect to the outer ring and each having its inner edge bearing against the hub 63. The inner ends of the lugs 87 lie along a circle concentric with the shaft 28 and this circle has a diameter slightly less than the outer diameter of the hub thus providing a tight fit between the hub and the lugs. The outer ring 86 abuts the flat areas of the spring fingers 76 lying between the bend 79 and the annular portion 75 so that the retainer 85 serves to stiffen the spring fingers 76 and to provide a fulcrum for each finger in the region of the bend 79 rather than at the junction of the finger with the annular portion 75.

Figure 11:
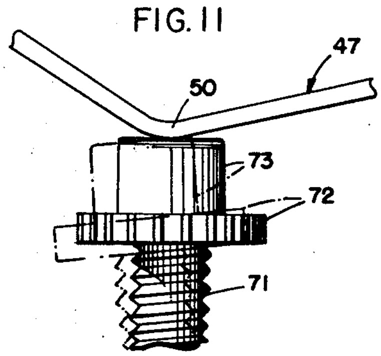
FIG. 11 is a fragmentary sectional view on an enlarged scale and taken along the lines 11—11 of FIG. 3.
Figure 11A:
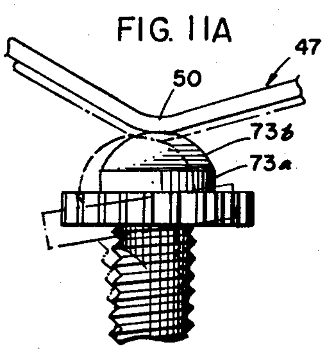
FIG. 11A is a view similar to FIG. 11 but showing a different adjustment screw head structure.

The cylindrically shaped head 73 of each adjusting screw 70 cooperates with the apex 50 of the lever to maintain the setting of the memory fine tuning adjustment over a relatively wide range of tolerances. Thus, referring to FIG. 11, it will be observed that the apex 50 rides upon the flat top of the head 73 of the active adjustment screw. As the carrier 62 is rotated to different channel selection positions the active adjustment screw may occupy slightly different angular positions due to variation of the detent mechanism 29 and other factors. Thus, the active adjustment screw may have occupied the angular position shown in full lines in FIG. 11 when the initial fine tuning adjustment was made but upon a subsequent selection of this same channel the active adjustment screw may be shifted to the slightly different angular position shown in dotted lines in FIG. 11. It will be observed that due to the provision of the flat topped head portion 73 the position of the apex 50 has not changed appreciably and therefore the initial fine tuning adjustment is maintained. If, on the other hand, the head portion 73 were rounded as shown in FIG. 11A by the head **73*a* which has a rounded upper surface 73*b*, the apex 50 is moved appreciably to the position shown in dotted lines in FIG. 11A upon a shift in the active adjustment screw position from the position shown in FIG. 11A in full lines to the dotted line position shown in this figure. This shift in the fine tuning adjustment is avoided by providing the flat top head portion 73** for each adjustment screw.

As was indicated above, the screws 70 are displaced around the carrier 62 so that different screws are engaged with the lever 42 as the selector shaft 28 is moved between its channel selecting positions. The apex 50 of the lever 42 is biased into engagement with the head 73 of the screw 70 corresponding to the channel selected and, hence, the position of that screw determines the position occupied by the lever 42 for the channel selected. The twelve screws correspond to the usual VHF television channels while the protuberance 68 is positioned to correspond to the UHF position of the channel selector shaft 28 in which position the VHF fine tuning impedance is not used. The protuberance 68 engages the apex 50 when the shaft is rotated to or through the UHF position and, hence, prevents the lever 42 from dropping down excessively in this position. Since the carrier 62 is in many instances rotated rapidly by the operator, the protuberance 68 simulates an active adjustment screw set to an approximate mid position and hence reduces wear on the lever 42 and its mounting arrangement.

By turning one of the screws 70 into or out of its slot 64 it is possible to adjust the inductance of the fine tuning device for the channel represented by that screw. When the screw 70 is fully threaded into its slot 64, the lever 42 is pivoted about the pin 53 to its maximum counterclockwise position as viewed in FIG. 2 while the lever occupies its maximum clockwise position when the screw is threaded as far as possible out of its slot 64. Any screw position between the two extremes causes the lever to occupy a position intermediate those full clockwise and counterclockwise positions. As long as the position of the screw for any particular channel is unchanged, the lever 42 will occupy the same position whenever that channel is selected by the shaft 28 and, hence, the reactance of the fine tuning device 36 will remain substantially constant for that channel. Thus, the screws 70 and their associated components may be said to form a memory device for remembering the fine tuning reactance desired for the various channels.

Figure 13:
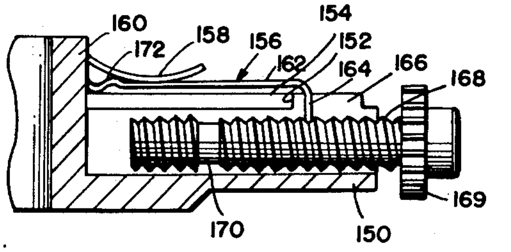
FIG. 13 is a sectional view similar to FIG. 7 of an alternative screw carrier and spring biasing arrangement.

As stated heretofore, the spring biased lever 42 exerts a force on the end of each adjustment screw 70 when the screw is brought into engagement with this lever. Furthermore this force is exerted on one or more adjustment screws each time the station selector shaft 28 is adjusted to a different channel. It will thus be seen that the adjustment screws 70 are subjected to a continual pounding on the ends thereof which tends to upset the adjustment of these screws. In FIG. 13 there is shown an alternative form of spring finger retainer which is particularly suited to withstand forces exerted on the ends of the adjustment screws by the spring biased lever 42. Referring to this figure, the screw carrier 150 is provided with a recess 152 in the outer face thereof which is adapted to receive a flat washer 154. A multifinger spring retainer 156 is held against the washer 154 by means of an internal toothed retaining ring 158 which engages the hub 160 of the carrier 150. The retainer 156 is provided with individual spring fingers 162 for each adjustment screw which have right angle end portions 164 which extend into the slots 166 and engage the threads of the adjustment screws 168. The slots 166 are provided with sloping shoulders at the bottom thereof similar to the shoulders 64*a* and 64*b* of FIG. 12.

In the arrangementment of FIG. 13, movement of the adjustment screw 168 toward the hub 160 in response to a force exerted by the lever 42 on the end of the screw is positively prevented because the right angle tip portion 164 wedges against the screw threads when such a force is exerted. In this connection, it is noted that the tip portion 164 is skewed to fit the helix of the screw threads of the screw 168. When the screw 168 is adjusted inwardly until the gear 169 engages the outer periphery of the carrier 150 the screw threads are turning in the proper direction to lift the tip portion 164 over the crest of the screw thread so that a disengaging action is provided in this inner limit position. However, when the screw 168 is turned in the opposite direction to move away from the hub 160 a restraining force exerted on the end of the screw would not cause the tip portion 164 to jump screw threads due to the above described wedging action of the tip portion 164 with the screw threads in this direction. Accordingly an outer limit position is provided in the embodiment of FIG. 13 by spoiling the thread of the screw 168 at an appropriate point along the length thereof, as indicated at 170 in FIG. 13, so that the screw cannot be withdrawn beyond the point at which the tip portion 164 engages the spoiled threads 170. The screw may then be restrained in this outer limit position without damage to the spring finger 162.

It will be noted that the spring finger retainer 156 is provided with an annular rib 172 near the central opening thereof. The rib 172 isolates the stresses set up in the retainer 156 when it is initially formed and heat treated so that all of the spring fingers 162 engage their respective adjustment screws with substantially the same pressure.

Figure 8:
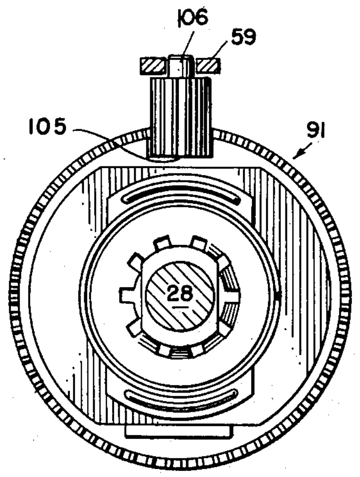
FIG. 8 is a sectional view taken along a line substantially corresponding to the line 8—8 in FIG. 3.

The memory fine tuning arrangement 43 of the present invention further includes an adjusting mechanism 90 for turning each of the screws 70 to effect a change in the fine tuning of the channel represented by the active adjustment screw. As was indicated above this adjusting mechanism includes a drive gear assembly 91 mounted for axial movement along the channel selector shaft 28 and including a pinion gear 94 adapted to mesh with the gear 72 on the adjusting screw of the selected channel when the assembly 91 is moved inwardly towards the front wall 22 from the position shown in FIG. 3 to that shown in FIG. 4. The assembly 91 comprises a support disc 92 having a hub portion 93 encircling the shaft 28. The disc 92 is shaped to provide an annular, outwardly facing recess 95 (FIG. 5) around the hub 93. The outer periphery 96 of the disc 92 is provided with three uniformly spaced radially extending notches 97 for respectively accommodating three angularly bent ears 98 extending outwardly from a crown gear 99. The crown gear has an annular body portion with an inwardly extending annular flange 100 thereon having gear teeth meshing permanently with the pinion 94. The inner diameter of the annular body portion is slightly greater than the outer diameter of the recess 95 while the flange 100 is dimensioned to fit over a gear carrier 101. This gear carrier includes an annular body portion having an inner recess 102 (FIG. 9) and an outer, inwardly extending peripheral flange 103 forming a clutch chamber 104. The periphery of the carrier 101 is flattened as indicated at 105 (FIG. 8) to form a support for a fixed non-rotating stub shaft 106 for carrying the pinion 94. As is best shown in FIG. 8, the end of the stub shaft 106 protrudes beyond the pinion 94 and into the space formed by the tines of the fork 59. The fork thus prevents the pinion 94 and its carrier 101 from moving bodily with the fine tuning knob 45 and the crown gear 99 although the pinion 94 is free to rotate. The carrier 101 is also provided with a pair of inwardly extending ribs 107 which engage the outer face of the disc 62 at the top and bottom thereof when the gear assembly 91 is moved inwardly along the shaft 28 towards the front wall 22. This limits inward movement of the assembly 91 and prevents rocking of this assembly when an axial force is exerted thereon as the sleeve is rotated. If the hub 93 is permitted to seat on the hub 63 the assembly 91 could rock and cause misalignment of the pinion gear 94 with the adjustment screws 70.

The inward axial movement of the gear assembly 91 along the shaft 28 is effected by manually turning the fine tuning knob 45 and the sleeve 46 to which the knob is non-rotatably secured. The rotary motion of the knob 45 is translated into axial movement of the gear assembly 91 by means of mating teeth 46*a* and 93*a* respectively formed on the sleeve 46 and the hub 93 of the support disc 92. More specifically, the sleeve 46 is substantially cylindrical but includes a pair of diametrically opposed longitudinal slots 46*b*, one of which is visible in FIG. 5, in its periphery cooperating with splines (not shown) formed at the interior of the knob 45 to provide a drive connection between these elements. The sleeve 46 further includes the two teeth 46*a* which extend inwardly from one end toward the front wall 22. The sleeve is prevented from moving axially along the shaft 28 by means of an internal annular shoulder 108 and a steel ring 112 cooperating with a pair of spaced retainer clips 109 and 110 carried by the shaft. The ring 112 fits within an annular recess 46*c* formed at one end of the sleeve 46 adjacent the shoulder 108. The retainer clips 109 and 110 are arcuate and are snapped over the shaft to seat within axially spaced annular grooves 111 and 111*a*. The retainer clip 110 thus abuts one end face of the shoulder 108 and the retainer clip 109 abuts an end face of the ring 112 to limit or inhibit axial movement of the sleeve 46 along the shaft 28. The teeth 46*a* mate exactly with the teeth 93*a* and the mating surfaces are true helices, that is, all cross sections taken at any point along the teeth are truly radial, thus providing full surface contact at all times. Therefore, as the knob 45 and the sleeve 46 are turned the helical surfaces on teeth 46*a* impart a force on the teeth 93*a* to move the entire gear assembly 91 axially along the shaft 28 towards the front wall 22 until the rib 107 strikes the disc 62 at which time the pinion 94 meshes with the gear 72 on the particular adjusting screw 70 which is located in position to engage the apex 50. The particular screw 70 which is in the latter position is, of course, determined by the position of the channel selector shaft 28 or, more generally, by the television channel selected. If the fine tuning knob 45 and the sleeve 46 are turned further after the pinion 94 engages the gear 72, the support disc 92 is rotated and the crown gear 99 is turned due to the locking action of the ears 98 and the notches 97. The crown gear turns the pinion 94 and thus turns the screw 70 to adjust the fine tuning of the selected channel.

Figure 9:
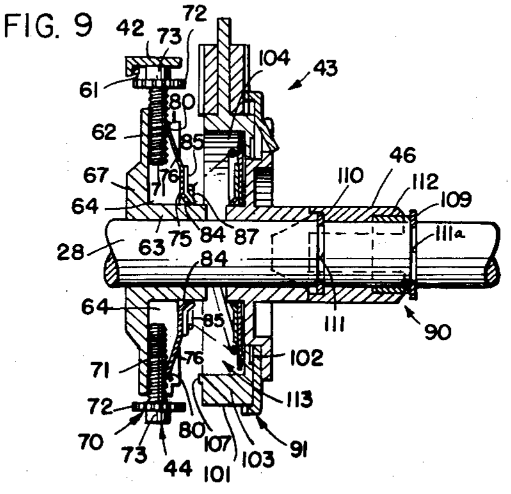
FIG. 9 is a sectional view taken along a line substantially corresponding to the line 9—9 in FIG. 2.

In accordance with another important feature of the invention, a slip clutch indicated generally by the reference numeral 113 in FIGS. 5 and 9 is employed to insure that the gear carrier 101 and the crown gear 99 will move together during axial shifting of the gear assembly 91 but to permit rotation of the crown gear while the gear carrier is held against rotation during adjustment of each screw 70. This slip clutch includes a first friction contact area between the outer flat surface 101*a* (FIG. 5) of the gear carrier 101 and the inner flat surface 99*a* of the crown gear. A second clutch surface exists between the inner flat surface 101*b* of the gear carrier 101 and a spring plate 114 mounted on the hub 93 of the support disc 92. More specifically, the hub 93 includes an inwardly extending portion having diametrically opposed peripheral flat regions forming a double D hub which fits within a correspondingly shaped central opening in the spring plate 114 to form a non-rotatable drive connection. The spring plate is a substantially flat leaf formed of resilient material such as beryllium copper but has a pair of indentations stamped therein forming ribs 114*a* which engage the inner flat surface 101*b*. The ribs 114*a* are arcuate in configuration and are concentric with the shaft 28. A retainer 115 is inserted onto the hub 93 to hold the spring plate 114 in position. This retainer comprises an annular ring having a plurality of equally spaced lugs 115*a* extending inwardly from the ring and bent toward the front wall 22. The inner ends of the lugs 115*a* bear against the hub 93 including its flat regions in order to lock the retainer 115 and the spring plate 114 on the hub. A beehive spring 116 having its inner end seated against the annular ring 86 of the retainer 85 and its outer end seated against the spring plate 114 normally urges the gear assembly 91 outwardly or towards the right as viewed in FIG. 1. The outward movement of the gear assembly is limited by the retainer clip 109 engaging the outer end of the steel ring 112 which, in turn, abuts the outer end face of the shoulder 108. The use of the separate, relatively hard ring 112 avoids excessive wear which would occur if the ring 109 were to bear directly against the edge of a relatively soft die casting like the sleeve 46 and its shoulder 108. Since neither the retainer nor the end of the sleeve 46 is continuous the retainer would quickly chew up the end of the sleeve if these two elements were in engagement. Since the retaining means is subjected almost constantly to the entire force of the spring 116 the components are highly susceptible to wear. In the construction of the present invention, however, the end of the shoulder 108 provides a continuous annular face engaging another continuous annular face on the hard ring 112 while the non-continuous retainer 109 engages another continuous annular surface at the outer end of the ring 112. This construction, therefore, avoids excessive wear and, hence, contributes to the long operating life of the tuner. The inner retainer 110 prevents the knob 45 and its sleeve 46 from being pushed axially along the shaft 28 and, hence, only rotation of this knob is effective to advance the gear assembly 91 to its operative or inner position shown in FIG. 4. Since the spring 116 provides the only force acting to return the gear assembly 91 to its neutral position shown in FIG. 3 the fine tuning knob must be free and its sleeve 46 must be free to turn on the channel selector shaft 28.

Turning now to the operation of the tuner 20 it will be understood that rotation of the channel selector shaft 28 to different angularly displaced positions is effective to select different television channels. The shaft 28 is accurately indexed in each channel selecting position by the indexing means 29. As the shaft 28 is turned the lever actuating means 44 turns with it to bring into operative position the memory screw 70 corresponding to the selected channel. This screw cooperates with the lever 42 to adjust the fine tuning impedance 36 to the proper value for the selected channel. If adjustment of the fine tuning becomes necessary for any particular channel, the knob 45 is turned to move the gear assembly 91 forward until the pinion 94 meshes with the gear 72 on the fine tuning screw 70 corresponding to that channel. Further rotation of the knob 45 turns the crown gear 99 while the pinion 94 and its carrier 101 are held against rotation around the shaft 28 by the fork 59. As the crown gear 99 turns the pinion 94 rotates and the screw 70 is moved into or out of its slot 64 depending upon the direction of rotation of the knob 45. The movement of the screw 70 pivots the lever 42 and adjusts the impedance of the fine tuning reactance 36. When the screw 70 reaches the position where the television picture is sharp and clear the knob 45 is released whereupon the beehive spring 116 disengages the pinion 94 from the gear 72 and returns the gear assembly 91 to the neutral position shown in FIG. 3.

While particular embodiments of the invention have been illustrated and described it will be understood that many changes and modifications will readily occur to those skilled in this art and it is, therefore, contemplated by the appended claims to cover any such changes and modifications as fall within the true spirit and scope of the invention.

What is claimed as new and desired to be secured by Letters Patent of the United States is:

1. In a fine tuning mechanism for use in a television tuner the combination of a fine tuning impedance device having a movable element, movable structure acting on said element to vary the impedance of said device, and means for moving said structure to different positions corresponding to the television channel selected, said means comprising a channel selector shaft rotatable to different channel selecting positions, a carrier mounted on said shaft for rotation therewith and a plurality of adjustable elements, one for each channel, mounted upon said carrier, different ones of said elements being effective to move said structure as said channel selector shaft is turned to its different channel selecting positions, and a single retainer having a plurality of fingers, one for each element, mounted on said carrier for holding all of said elements on said carrier.

2. In a fine tuning mechanism for use in a television tuner the combination of a fine tuning impedance device having a movable element, movable structure acting on said element to vary the impedance of said device, and means for moving said structure to different positions corresponding to the television channel selected, said means comprising a channel selector shaft rotatable to different channel selecting positions, a carrier mounted on said shaft for rotation therewith and a plurality of adjustment screws, one for each channel, mounted upon said carrier, different ones of said screws being effective to move said structure as said channel selector shaft is turned to its different channel selecting positions, said carrier including a plurality of generally radial recesses each containing one of said screws, a single retainer having a plurality of fingers, one for each recess, for holding all of said screws on said carrier, each of said fingers extending into one of said recesses and including means thereon engaging the threads of the screw in that recess.

3. The combination defined by claim 2 wherein each of said fingers is provided with a transverse tip portion resiliently urged into engagement with the threads of the corresponding screw, whereby forces exerted on the end of said screw are prevented from moving said screw radially inwardly.

4. The combination defined by claim 3, wherein each of said screws is provided with a mutilated thread portion to provide an outer limit of travel of the screw.

5. The combination defined by claim 2 wherein said radial slots in said carrier are each provided with sloping shoulders at the bottom thereof against which the corresponding adjustment screw is held, thereby to provide an accurately located bearing for said adjustment screws.

6. The combination defined in claim 2 wherein each spring finger extends into one of said slots and is provided with a bent portion engaging the screw threads in that slot.

7. The combination defined in claim 6 wherein the bent portion of said spring fingers are skewed to conform to the helix of the screw threads.

8. The combination defined in claim 2 wherein said channel selector shaft is provided with an extra position and said carrier is provided with a peripheral lug adapted to engage said structure when said shaft is in said extra position.

9. In a fine tuning arrangement for use in a television tuner of the type comprising a channel selector shaft mounted upon a chassis and rotatable to different channel selecting positions, the combination of a single variable fine tuning impedance for all of said channels and having a movable core, a lever mounted for pivotal movement with respect to said chassis and having a portion acting against said core, said lever having an integral portion forming a bearing channel of generally square shaped cross section, a fixed pivot pin fitting within said channel to support said lever for pivotal movement, lever actuating means comprising a carrier mounted on said shaft and rotatable therewith, a plurality of elements each adjustable radially of said carrier for engaging said lever to hold it in its different positions, each of said elements comprising a threaded screw extending radially of the shaft, adjusting means for turning each screw to adjust its radial position, and a single retainer having a plurality of spring fingers, one for each adjustment screw for holding the same in its adjusted position.

10. The apparatus defined by claim 9 wherein each screw includes a cylindrical head having a flat outer portion engaging a bent portion of said lever.

11. In a tuner, the combination of a chassis, a shaft supported for rotation upon said chassis, an assembly mounted for movement axially along said shaft, resilient means acting upon said assembly to urge it for movement in a predetermined axial direction, and means for limiting movement of said assembly in said predetermined direction, said limiting means comprising a retainer mounted in fixed position upon said shaft, a ring formed of relatively hard material encircling said shaft and having a pair of end faces, one of which abuts said retainer, and structure connected with said assembly and extending around said shaft and having a surface engaging the other end surface of said ring.

12. The combination defined by claim 11 wherein said retainer comprises a clip snapped into a groove in said shaft.

13. The combination defined by claim 11 wherein said structure comprises a sleeve encircling said shaft and having an internal annular shoulder thereon engaging said other end surface of said ring.

14. The combination defined by claim 12 wherein said structure comprises a sleeve encircling said shaft and having an internal annular shoulder thereon engaging said other end surface of said ring.

15. In a fine tuning mechanism for use in a tuner, the combination of a chassis, a shaft supported for rotation upon said chassis, an assembly mounted for axial movement upon said shaft, and means including a fine tuning knob for moving said assembly axially in response to rotation of said knob, said means comprising a sleeve encircling said shaft and secured to said knob for rotation therewith, means for preventing axial movement of said sleeve along said shaft, said assembly including a plurality of members extending parallel to the axis of the shaft towards said sleeve, said sleeve including a plurality of members extending parallel to the axis of the shaft and interfitting with the members on said assembly, said members having engaging cam faces for translating the rotary movement of said knob and said sleeve into axial movement of said assembly.

16. The apparatus defined by claim 15 wherein the means for preventing axial movement of the sleeve comprises first and second spaced apart retainers mounted in fixed positions upon said shaft.

17. In a fine tuning arrangement for use in a television tuner of the type comprising a channel selector shaft mounted upon a chassis and rotatable to different channel selecting positions, the combination of a single variable fine tuning impedance for all of said channels and having a movable core, a lever mounted for pivotal movement with respect to said chassis and having a portion acting against said core, said lever having an integral portion forming an elongated bearing channel of generally square shaped cross section extending transversely of said lever and generally parallel to said shaft, a fixed pivot pin fitting within said channel to support said lever for pivotal movement, and lever actuating means mounted on said shaft and engaging said lever at a point intermediate said channel and said core for moving said lever to different positions as said shaft is turned to its different channel selecting positions.

18. The apparatus defined by claim 17 wherein the lever includes a body portion bent to form an apex engaging said lever actuating means.

19. The apparatus defined by claim 18 wherein the lever actuating means comprises a carrier mounted on said shaft and rotatable therewith and a plurality of elements each adjustable radially of said carrier for engaging the apex of said lever to hold the lever in its different positions.

20. In a fine tuning arrangement for use in a television tuner of the type comprising a channel selector shaft mounted upon a chassis and rotatable to different channel selecting positions, the combination of a single variable fine tuning impedance for all of said channels and having a movable element, a lever mounted for pivotal movement with respect to said chassis and having a portion acting against said element, lever actuating means comprising a carrier mounted on said shaft and rotatable therewith, a plurality of elements each adjustable radially of said carrier for engaging said lever to hold it in its different positions, each of said radially adjustable elements comprising a threaded screw extending radially of the shaft, adjusting means for turning each screw to adjust its radial position, and said screw including a cylindrical head having a flat outer portion engaging said lever.

21. The apparatus defined by claim 20 wherein said lever comprises a body portion bent to form an apex intermediate the lever ends, said apex seating on the flat outer head portion of the different adjusting screws when the shaft is moved to its different channel selecting positions.

22. The apparatus defined by claim 20 wherein said lever carries structure for inhibiting movement of said screws in a direction extending transversely to the longitudinal axis of the screw.

23. The apparatus defined by claim 21 wherein said lever carries structure adjacent said apex for inhibiting movement of said screws in a direction extending transversely to the longitudinal axis of said screws.

24. The apparatus defined by claim 1 wherein said retainer comprises an annular body portion having said fingers extending outwardly therefrom and each such finger being bent intermediate its ends so that the outer end portion of each finger extends somewhat axially of said shaft to engage one of the radially adjustable elements, and a stiffening member disposed adjacent said retainer and engaging the annular portion thereof so that the outer portions of the fingers flex about the bends in the fingers.

25. In a tuner, the combination of a chassis, a shaft supported for rotation upon said chassis, an assembly having a first portion mounted for movement axially of said shaft, resilient means acting upon said first portion of said assembly to urge it for movement in a predetermined axial direction, said assembly being manually slidable along said shaft in a direction opposite to said predetermined direction and against said resilient means, means for limiting movement of said assembly in said predetermined direction, said limiting means comprising a first retainer mounted in fixed position upon said shaft and a second portion of said assembly interconnected with said slidable portion thereof, and a second retainer mounted in fixed position upon said shaft at a position spaced axially from said first retainer for engaging said second portion of said assembly to limit the movement thereof in said opposite direction when said first portion of said assembly is manually moved against said resilient means.

26. The combination defined by claim 25 wherein said limiting means comprises a ring of relatively hard material encircling said shaft and having a pair of end faces, one of which abuts said first retainer, said second portion of said assembly having a surface engaging the other end surface of said ring.

27. The combination defined by claim 25 wherein each of said retainers comprises a clip snapped into a groove in said shaft.

28. The combination defined by claim 26 wherein each of the retainers comprises a clip snapped into a groove in the shaft.

29. The combination defined by claim 26 wherein said second portion of said assembly comprises a member encircling said shaft and having an internal first shoulder engaging said other end surface of said ring and a second shoulder engaging said second retainer when said assembly is manually moved in said opposite direction.

30. The combination defined by claim 28 wherein said second portion of said assembly structure comprises a member encircling said shaft and having an internal first shoulder engaging said other end surface of said ring and a second shoulder engaging said second retainer when said assembly is manually moved in said opposite direction.

References Cited by the Examiner

UNITED STATES PATENTS

| | | | |
|---|---|---|---|
| 2,487,803 | 11/49 | Heimann. | |
| 2,828,985 | 4/58 | Ridenour | 308—237 X |
| 3,065,642 | 11/62 | Cappelle et al. | 74—10.27 |
| 3,069,638 | 12/62 | Lindeman et al. | 74—10.54 X |
| 3,090,932 | 5/63 | Torrence | 74—10.8 X |

BROUGHTON G. DURHAM, *Primary Examiner.*

MILTON KAUFMANN, *Examiner.*

UNITED STATES PATENT OFFICE

CERTIFICATE OF CORRECTION

Patent No. 3,191,446 June 29, 1965

Jimmie E. Warthan

It is hereby certified that error appears in the above numbered patent requiring correction and that the said Letters Patent should read as corrected below.

Column 16, line 60, after "said" insert -- first portion of said --.

Signed and sealed this 25th day of January 1966.

(SEAL)
Attest:

ERNEST W. SWIDER
Attesting Officer

EDWARD J. BRENNER
Commissioner of Patents